(12) United States Patent
Ko

(10) Patent No.: US 11,553,608 B2
(45) Date of Patent: Jan. 10, 2023

(54) WEARABLE ELECTRONIC DEVICE INCLUDING VENTILATION AND WATERPROOF STRUCTURE

(71) Applicant: Samsung Electronics Co., Ltd., Gyeonggi-do (KR)

(72) Inventor: Youngjae Ko, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/125,045

(22) Filed: Dec. 17, 2020

(65) Prior Publication Data

US 2021/0195772 A1 Jun. 24, 2021

(30) Foreign Application Priority Data

Dec. 20, 2019 (KR) .......................... 10-2019-0171668

(51) Int. Cl.
*H05K 5/02* (2006.01)
*H05K 5/00* (2006.01)

(52) U.S. Cl.
CPC ......... *H05K 5/0213* (2013.01); *H05K 5/0017* (2013.01); *H05K 5/0086* (2013.01)

(58) Field of Classification Search
None
See application file for complete search history.

(56) References Cited

U.S. PATENT DOCUMENTS

| 3,858,388 | A | * | 1/1975 | Fujimori | ................ G04B 39/02 368/294 |
| 4,234,948 | A | * | 11/1980 | Maekawa | ............ G04B 37/084 368/294 |
| 5,707,757 | A | | 1/1998 | Lee | |
| 6,116,774 | A | * | 9/2000 | Sasaki | .................. C08G 18/672 528/44 |
| 8,908,380 | B2 | | 12/2014 | Ohhashi et al. | |
| 9,886,065 | B2 | | 2/2018 | Raff | |
| 10,028,043 | B2 | * | 7/2018 | Kuki | ....................... B32B 27/32 |
| 10,285,643 | B2 | * | 5/2019 | Perkins | .................. G04B 37/08 |
| 10,345,760 | B2 | | 7/2019 | Kayano | |
| 10,353,430 | B2 | | 7/2019 | Kim | |
| 10,485,126 | B2 | | 11/2019 | Yanagisawa et al. | |
| 10,534,403 | B2 | | 1/2020 | Raff | |
| 10,564,738 | B2 | * | 2/2020 | Lim | ..................... G04G 17/045 |

(Continued)

FOREIGN PATENT DOCUMENTS

| CN | 102833970 A | 12/2012 |
| CN | 103777697 A | 5/2014 |

(Continued)

OTHER PUBLICATIONS

International Search Report dated Mar. 18, 2021.

(Continued)

*Primary Examiner* — Xanthia C Cunningham
(74) *Attorney, Agent, or Firm* — Cha & Reiter, LLC

(57) ABSTRACT

Provided is an electronic device including a housing, a plate coupled to one surface of the housing, and an adhesive member at least partially disposed in a coupling portion between the housing and the plate and including a plurality of layers. The adhesive member includes at least one waterproof-ventilation layer to perform a ventilation function and a waterproof function.

19 Claims, 11 Drawing Sheets

(56) References Cited

U.S. PATENT DOCUMENTS

| | | | |
|---|---|---|---|
| 10,698,367 B2 | 6/2020 | Park et al. | |
| 11,102,899 B2* | 8/2021 | Park | H05K 5/069 |
| 11,132,029 B2 | 9/2021 | Raff | |
| 2005/0111307 A1* | 5/2005 | Saaski | G04G 17/02 |
| | | | 368/314 |
| 2008/0123014 A1 | 5/2008 | Lin | |
| 2011/0221688 A1* | 9/2011 | Byun | H04B 1/385 |
| | | | 345/173 |
| 2011/0261510 A1 | 10/2011 | Liu | |
| 2012/0118628 A1* | 5/2012 | Pakula | H04M 1/0249 |
| | | | 156/242 |
| 2013/0135972 A1* | 5/2013 | Nakamura | G04G 21/02 |
| | | | 368/11 |
| 2013/0156985 A1* | 6/2013 | Karube | B32B 7/06 |
| | | | 428/41.8 |
| 2014/0241564 A1 | 8/2014 | Kang et al. | |
| 2015/0146905 A1* | 5/2015 | Abe | H04R 1/086 |
| | | | 524/588 |
| 2015/0187189 A1 | 7/2015 | Kono et al. | |
| 2016/0058375 A1* | 3/2016 | Rothkopf | G06F 1/163 |
| | | | 600/323 |
| 2016/0147293 A1 | 5/2016 | Park et al. | |
| 2016/0228826 A1 | 8/2016 | Furuuchi | |
| 2016/0313700 A1* | 10/2016 | Fraser | G04B 37/084 |
| 2017/0006369 A1* | 1/2017 | Kenaley | G10K 11/002 |
| 2017/0303409 A1* | 10/2017 | Maeda | B01D 53/268 |
| 2018/0022063 A1* | 1/2018 | Berrang | B32B 3/08 |
| | | | 442/224 |
| 2018/0063981 A1* | 3/2018 | Park | H04R 1/023 |
| 2018/0173166 A1* | 6/2018 | Kayano | G04G 17/08 |
| 2018/0329250 A1* | 11/2018 | Stoller | G02F 1/1347 |
| 2019/0191580 A1* | 6/2019 | Yang | H05K 5/0086 |
| 2019/0255801 A1 | 8/2019 | Seo | |
| 2019/0310155 A1* | 10/2019 | Seo | G01L 19/145 |
| 2021/0251095 A1* | 8/2021 | Fukushima | H05K 5/069 |

FOREIGN PATENT DOCUMENTS

| | | |
|---|---|---|
| CN | 105630153 A | 6/2016 |
| CN | 108227459 A | 6/2018 |
| CN | 207854300 U | 9/2018 |
| CN | 109164693 A | 1/2019 |
| CN | 109203623 A | 1/2019 |
| EP | 2381332 A2 | 10/2011 |
| EP | 3 065 518 A1 | 10/2014 |
| EP | 3032379 A2 | 6/2016 |
| GB | 2508763 A | 6/2014 |
| JP | 2001-021671 A | 1/2001 |
| JP | 2009010234 A | 1/2009 |
| JP | 2011-205002 A | 10/2011 |
| JP | 2012194972 A | 10/2012 |
| JP | 2016022415 A | 2/2016 |
| KR | 1997-0004111 A | 1/1997 |
| KR | 10-2018-0006046 A | 1/2018 |
| KR | 10-2018-0138249 A | 12/2018 |
| WO | 2012/117738 A1 | 9/2012 |
| WO | 2019/050207 A1 | 3/2019 |

OTHER PUBLICATIONS

European Search Report dated Jun. 1, 2021.
European Search Report dated Sep. 30, 2021.
Chinese Search Report dated Dec. 3, 2021.
Chinese Office Action dated Jun. 22, 2022.

* cited by examiner

<401>

<402>

<403>

<601>

<602>

WEARABLE ELECTRONIC DEVICE INCLUDING VENTILATION AND WATERPROOF STRUCTURE

CROSS-REFERENCE TO RELATED APPLICATION(S)

This application is based on and claims priority under 35 U.S.C. § 119 to Korean Patent Application No. 10-2019-0171668, filed on Dec. 20, 2019, in the Korean Intellectual Property Office, the disclosure of which is incorporated by reference herein its entirety.

BACKGROUND

1. Field

The disclosure relates to a wearable electronic device including a ventilation and waterproof structure.

2. Description of Related Art

Various types of electronic devices, such as a smartphone, a tablet personal computer (PC), a personal digital assistant (PDA), an electronic notebook, a laptop computer, or a wearable device, have been developed. Moreover, electronic devices now cover functions of a number of other devices. For example, the electronic device may provide call functions, such as voice and video calls, message transmission and reception functions such as a short message service (SMS)/a multimedia message service (MMS) and an e-mail, an electronic notebook function, a photographing function, a broadcast reproducing function, a video reproducing function, a music reproducing function, an Internet function, an messenger function, a game function, or a social networking service (SNS) function.

One of the various types of electronic devices may be a wearable electronic device. The wearable electronic device may be put on part of a body of a user, such as a wristwatch.

The above information is presented as background information only to assist with an understanding of the disclosure. No determination has been made, and no assertion is made, as to whether any of the above might be applicable as prior art with regard to the disclosure.

SUMMARY

In accordance with an aspect of the disclosure, an electronic device may include a housing, a plate coupled to one surface of the housing, and an adhesive member at least partially disposed in a coupling portion between the housing and the plate and including a plurality of layers. The adhesive member may include at least one waterproof-ventilation layer to perform a ventilation function and a waterproof function.

In accordance with another aspect of the disclosure, an electronic device may include a side bezel structure, a display disposed inside the side bezel structure, a plate coupled to the side bezel structure, in a displaying direction of the display, and an adhesive member at least partially disposed in a coupling portion between the side bezel structure and the plate and including a plurality of layers. The adhesive member may include at least one waterproof-ventilation layer to perform a ventilation function and a waterproof function.

In accordance with another aspect of the disclosure, an electronic device may include a side bezel structure, a first plate coupled to one surface which is open in the side bezel structure, a sensor disposed on the first plate, a second plate coupled to the first plate to cover the sensor, and an adhesive member at least partially disposed in a coupling portion between the first plate and the second plate and including a plurality of layers. The adhesive member may include at least one waterproof-ventilation layer to perform a ventilation function and a waterproof function.

Other aspects, advantages, and salient features of the disclosure will become apparent to those skilled in the art from the following detailed description, which, taken in conjunction with the annexed drawings, discloses certain embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

In the following description made with respect to the accompanying drawings, similar components will be assigned with similar reference numerals.

DETAILED DESCRIPTION

A wearable electronic device can have additional ventilation holes to prevent a moisture concentration therein or to prevent a damage to the internal components as a result of changing air pressure. Changing air pressure can come about within the wearable electronic device over time, as well as a pressure differential within the wearable electronic device and the external environment. To solve the problems, the wearable electronic device can use a ventilation structure communicating with the ventilation hole and an additional space to provide the ventilation structure.

Aspects of the disclosure are to address at least the above-mentioned problems and/or disadvantages and to provide at least the advantages described below. Accordingly, an aspect of the disclosure is to provide a wearable electronic device capable of providing a ventilation function and a waterproof function using a coupling portion between a housing and a front plate (or rear plate) without forming an additional ventilation hole.

Hereinafter, certain embodiments of the disclosure may be described with reference to accompanying drawings. Accordingly, those of ordinary skill in the art will recognize that modification, equivalent, and/or alternative on the certain embodiments described herein can be variously made without departing from the scope and spirit of the disclosure.

Figure 1:
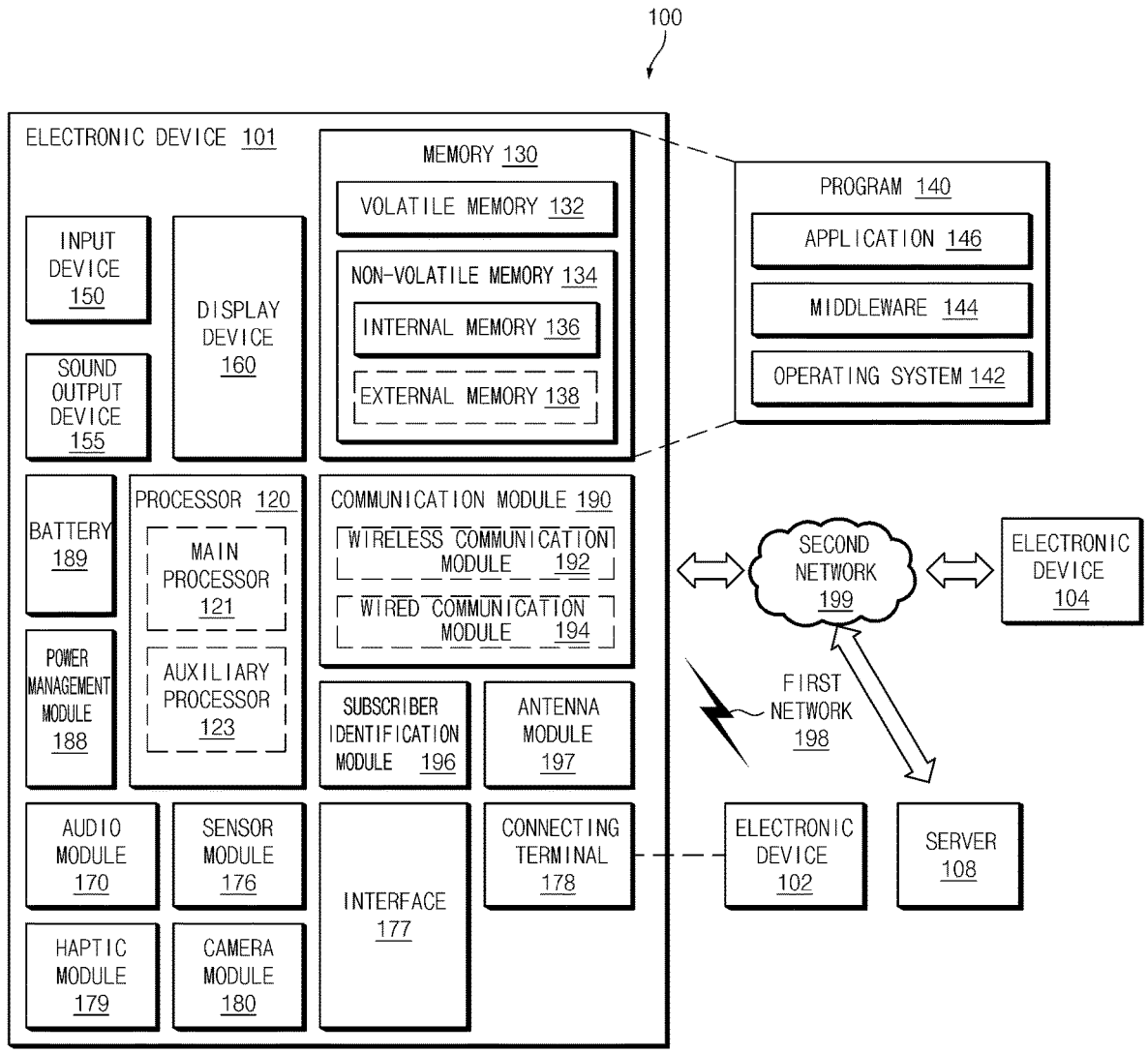
FIG. 1 is a block diagram illustrating an electronic device in a network environment according to certain embodiments.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101.

According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
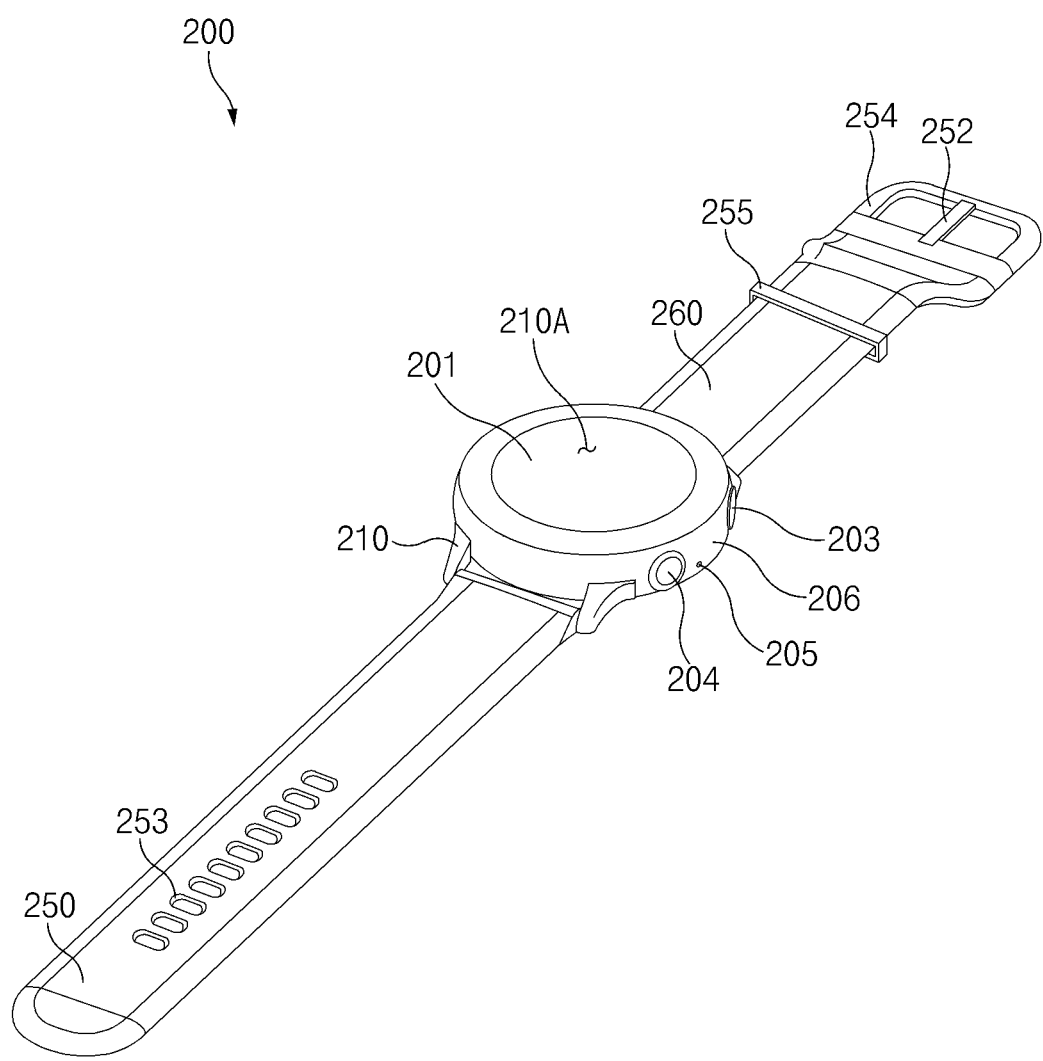
FIG. 2A is a perspective view illustrating a front surface of a wearable electronic device, according to an embodiment.
Figure 2B:
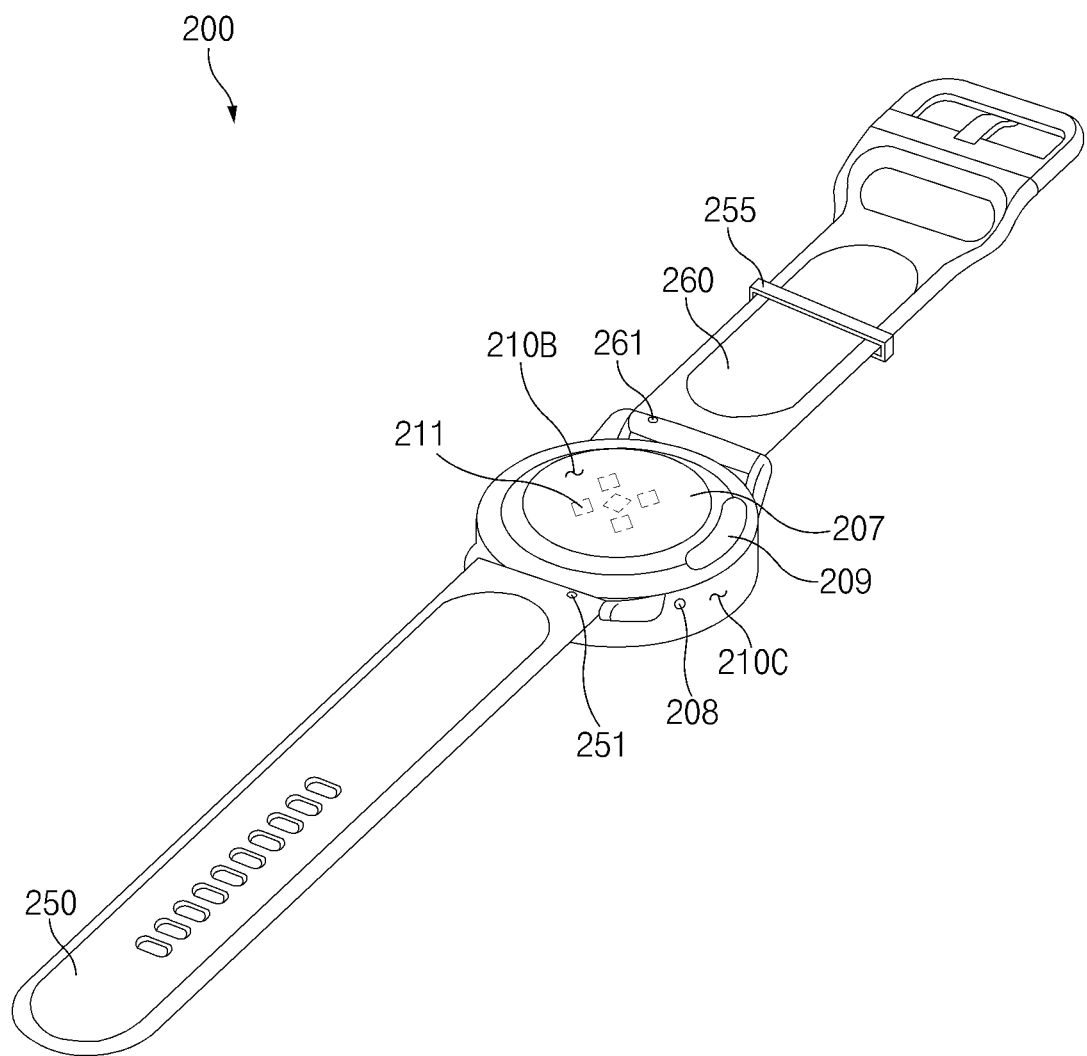
FIG. 2B is a perspective view illustrating a rear surface of the wearable electronic device of FIG. 2A.
Figure 3:
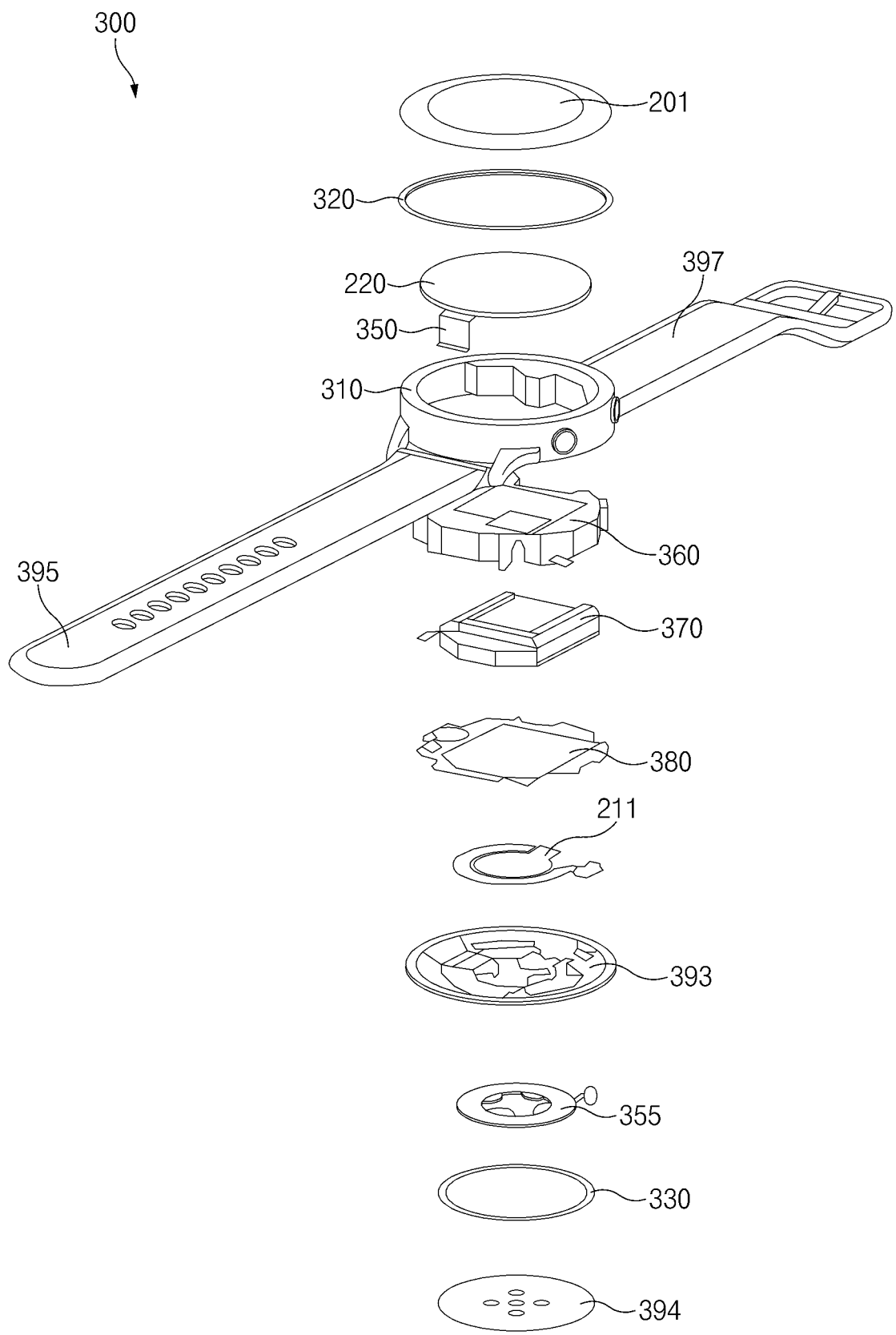
FIG. 3 is an exploded perspective view illustrating the electronic device of FIG. 2A.

FIG. 2A is a perspective view illustrating a front surface of a wearable electronic device, according to an embodiment. FIG. 2B is a perspective view illustrating a rear surface of the wearable electronic device of FIG. 2A. FIG. 3 is an exploded perspective view illustrating the wearable electronic device of FIG. 2A.

Referring to FIGS. 2A and 2B, an wearable electronic device 200 may include a housing 210 including a first surface 210A (or front surface), a second surface 210B (or rear surface), and a side surface 210C. The first surface 210A, second surface 210B, and the side surface 210C surround a space therebetween. The wearable electronic device 200 includes straps 250 and 260 coupled to at least a portion of the housing 210. The straps are configured to detachably fasten the wearable electronic device 200 to a part (e.g., a wrist or ankle) of a body of a user. In another embodiment (not illustrated), the housing 210 may be referred to as the structure forming some of the first surface 210A, the second surface 210B, and the side surface 210C of FIG. 2A.

According to an embodiment, the first surface 210A may include a front plate 201 (e.g., a glass plate or a polymer plate including various coating layers) having at least a portion substantially transparent. The second surface 210B may be formed through a rear plate 207 substantially opaque. The rear plate 207 may include, for example, coated or colored glass, ceramic, polymer, metal (e.g., aluminum, stainless steel (STS), or magnesium) or the combination of at least two of the above materials. The side surface 210C may include a side bezel structure (or "side member") 206 which is coupled to the front plate 201 and the rear plate 207, and includes metal and/or polymer. In an embodiment, the rear plate 207 and the side bezel structure 206 may be formed integrally with each other and may include the same material (e.g., a metal material such as aluminum). The binding members 250 and 260 may be formed of various materials and in various shapes. The binding members 250 and 260 may be formed to allow an integral-type link or a plurality of unit links to float using woven fabric, leather, rubber, urethane, metal, ceramic, or a combination of at least two of the above materials.

The wearable electronic device 200 includes at least one of a display 220 (see FIG. 3), audio modules 205 and 208, a sensor module 211, key input devices 203 and 204, and a connector hole 209. In an embodiment, the wearable electronic device 200 may omit at least one (e.g., the key input devices 203 and 204, the connector hole 209, or the sensor module 211) of components or may additionally include different components.

The display 220 may be exposed, for example, through a substantial portion of the front plate 201. The shape of the display 220 may be in the shape corresponding to the shape of the front plate 201, and may be in various shapes such as a circular shape, an oval shape, or a polygonal shape. The display 220 may be coupled or disposed adjacent to a touch sensing circuit, a pressure sensor to measure the intensity (pressure) of a touch, and/or a fingerprint sensor.

The audio modules 205 and 208 may include the microphone hole 205 and the speaker hole 208. The microphone hole 205 may have a microphone disposed therein to obtain an external sound. In an embodiment, a plurality of microphones may be disposed therein to sense the direction of a sound. The speaker hole 208 may be used as an external speaker and a receiver for a call. In an embodiment, the speaker hole 208 and the microphone hole 205 may be implemented in the form of one hole or a speaker may be included without the speaker hole 208 (e.g., a piezoelectric speaker).

According to an embodiment, the sensor module 211 may generate electrical signals or data values corresponding to an internal operating state or an external environment state of the wearable electronic device 200. The sensor module 211 may include, for example, a biometric sensor module (e.g., an HRM sensor) disposed on the second surface 210B of the housing 210. The wearable electronic device 200 may further include a sensor module (is not illustrated), for example, at least one of a gesture sensor, a gyro sensor, an air pressure sensor, a magnetic sensor, an acceleration sensor, a grip sensor, a color sensor, an infrared sensor, a biometric sensor, a temperature sensor, a humidity sensor, or an illuminance sensor.

According to an embodiment, the key input devices 203 and 204 may include side key buttons 203 and 204 which are disposed on the side surface 210C of the housing 210. In another embodiment, the wearable electronic device 200 may not include some or all of the key input devices 203 and 204 and the key input devices 203 and 204 not included may be implemented in a different form, such as a soft key, on the display 220. The connector hole 209 may receive a connector (e.g., a USB connector) to transmit and receive power and/or data together with the external electronic device and may include another connector hole (not illustrated) to receive a connector to transmit or receive an audio signal together with the external electronic. The wearable electronic device 200 may further include a cover (not illustrated) to cover at least a portion of the connector hole 209 and to prevent external foreign matters from being introduced into the connector hole.

According to an embodiment, the binding members 250 and 260 may be detachably bound to at least some region of the housing 210 using locking members 251 and 261. The binding members 250 and 260 may include one or more of a fixing member 252, a fixing member coupling hole 253, a band guide member 254, and a band fixing ring 255.

According to an embodiment, the fixing member 252 may be configured to fix the housing 210 and the binding members 250 and 260 to the part (e.g., a wrist or an ankle) of the body of the user. The fixing member coupling hole 253 may fix the housing 210 and the binding members 250 and 260 to the part of the body of the user to correspond to the fixing member 252. The band guide member 254 is configured to restrict the motion range of the fixing member 252 when the fixing member 252 is coupled to the fixing member coupling hole 253, such that the binding members 250 and 260 bind the part of the body of the user while making close contact with the binding members 250 and 260. The band fixing ring 255 may restrict the motion range of the binding members 250 and 260 in the state in which the fixing member 252 and the fixing member coupling hole 253 are fastened together.

The wearable electronic device 200 can include electronic components which produce heat. The heat causes the air within the housing to expand, thereby increasing the air pressure. Additionally, an air pressure differential can occur between the air pressure inside the housing and outside the housing. The foregoing can cause wear and tear to the wearable electronic device 200. While a ventilation hole can alleviate this, ventilation holes also allow water, moisture, and foreign substances to enter. To prevent this, the wearable electronic device can use an adhesive members between the front plate 201 and the side bezel structure 206. The adhesive member 320 can include a waterproof-ventilation layer that permits gas, but blocks liquid.

Referring to FIG. 3, a wearable electronic device 300 (e.g., the electronic device 101 and the wearable electronic device 200) may include the front plate 201, a first adhesive member 320, the display 220, a first antenna 350, a side bezel structure 310, a support member 360 (e.g., bracket), a battery 370, a printed circuit board 380, a second antenna 355, a first rear plate 393, a second adhesive member 330, a second rear plate 394, and straps 395 and 397. At least one of components of the wearable electronic device 300 may be identical to or similar to at least one of components of the wearable electronic device 200 of FIG. 2A or FIG. 2B, and the redundant details will be omitted.

The first adhesive member 320 is disposed between the front plate 201 and the side bezel structure 310. The second adhesive member 330 is disposed between the first rear plate 393 and the second rear plate 394. The adhesive members 320 and 330 include a plurality of layers and may include at least one waterproof-ventilation layer. The at least one waterproof ventilation layer permits gas to pass through but blocks liquid.

The wearable electronic device 300 may prevent, without an additional ventilation hole, a dew concentration therein or to prevent a joint part of the wearable electronic device 300 from being broken (the joint part of the wearable electronic device 300 is broken as the internal air of the wearable electronic device is expanded due to the rapid change in atmospheric pressure) when external atmospheric pressure and an external temperature are changed. Additionally, the first adhesive member 320 and/or second adhesive member 330 may provide a waterproof function.

The support member 360 is disposed in the wearable electronic device 300 to be coupled to the side bezel structure 310 or to be integrated with the side bezel structure 310. The support member 360 may include, for example, a metal material and/or a non-metal material (e.g., polymer). The support member 360 may have one surface coupled to the display 220 and an opposite surface coupled to the printed circuit board 380. A processor, a memory, and/or an interface may be mounted on the printed circuit board 380. The processor may include, for example, one or more of a central processing unit, an application processor, a graphic processing unit (GPU), an application processor, a sensor processor, or a communication processor.

The memory may include, for example, a volatile memory and/or a non-volatile memory. The interface may include, for example, a high definition multimedia interface (HDMI), a universal serial bus (USB) interface, an SD card interface, and/or an audio interface. The interface may, for example, electrically or physically connect the wearable electronic device 300 with the external electronic device and may include a USB connector, an SD card/MMC connector, or an audio connector.

According to an embodiment, the battery 370 may be a device to supply power to at least one component of the wearable electronic device 300, for example, a non-rechargeable primary battery, or a rechargeable secondary battery. At least a portion of the battery 370 may be on the substantially same plane as a plane of the printed circuit board 380. The battery 370 may be disposed inside the wearable electronic device 300 integrally with the wearable electronic device 300, and may be disposed detachably from the wearable electronic device 300.

According to an embodiment, the sensor module 211 may be interposed between the printed circuit board 380 and the first rear plate 393. According to an embodiment, the sensor module 211 may generate electrical signals or data values corresponding to an internal operating state of the wearable electronic device 300 or an external environment state. The sensor module 211 may include a biometric sensor module (e.g., an HRM sensor). The sensor module 211 may include at least one of a gesture sensor, a gyro sensor, an air pressure sensor, a magnetic sensor, an acceleration sensor, a grip sensor, a color sensor, an infrared sensor, a biometric sensor, a temperature sensor, a humidity sensor, or an illuminance sensor.

According to an embodiment, the first antenna 350 may be interposed between the display 220 and the support member 360. The first antenna 350 may include, for example, a near field communication (NFC) antenna, a wireless charging antenna, and/or a magnetic secure transmission (MST) antenna. The first antenna 350 may make local area network communication with an external device or may wirelessly transmit or receive power necessary for charging. In addition, the first antenna 350 may transmit a magnetic-based signal including a local area network communication signal or payment data. In another embodiment, an antenna structure may be formed by a portion or the combination of the side bezel structure 310 and/or the support member 360.

According to an embodiment, the second antenna 355 may be interposed between the first rear plate 393 and the second rear plate 394. The second antenna 355 may include, for example, a near field communication (NEC) antenna, a wireless charging antenna, and/or a magnetic secure transmission (MST) antenna. The second antenna 355 may make local area network communication with an external device or may wirelessly transmit or receive power necessary for charging. In addition, the second antenna 355 may transmit a magnetic-based signal including a local area network communication signal or payment data. In another embodiment, an antenna structure may be formed by a portion or the combination of the side bezel structure 310 and/or the first rear plate 393.

The first adhesive member 320 may be interposed between the front plate 201 and the side bezel structure 310. The first adhesive member 320 may be configured to block moisture and a foreign matter from being introduced into a space, which is surrounded by the front plate 201 and the side bezel structure 310, from the outside. In addition, the first adhesive member 320 may include a plurality of layers and may include at least one waterproof-ventilation layer. The at least one ventilation-waterproof layer may transmit gas and block liquid.

According to an embodiment, the second adhesive member 330 may be interposed between the first rear plate 393 and the second rear plate 394. The second adhesive member 330 may be configured to block moisture and a foreign matter from being introduced into a space, which is surrounded by the first rear plate 393 and the second rear plate 394, from the outside. In addition, the second adhesive member 330 may include a plurality of layers and may include at least one ventilation-waterproof layer. The at least one ventilation-waterproof layer may transmit gas and block liquid.

As described above, the wearable electronic device 300 may provide a ventilation function through the first adhesive member 320 or the second adhesive member 330.

Figure 4A:
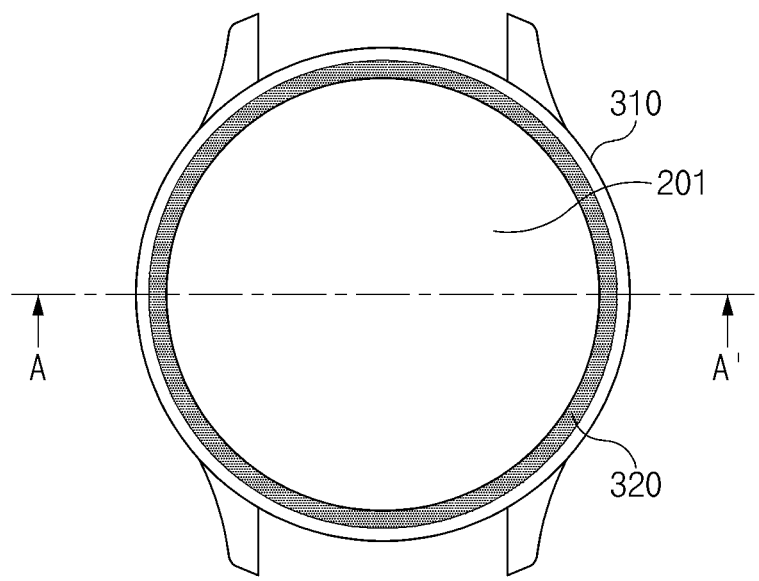
FIG. 4A is a view illustrating the wearable electronic device of FIG. 2A when viewed from the front.
Figure 4B:
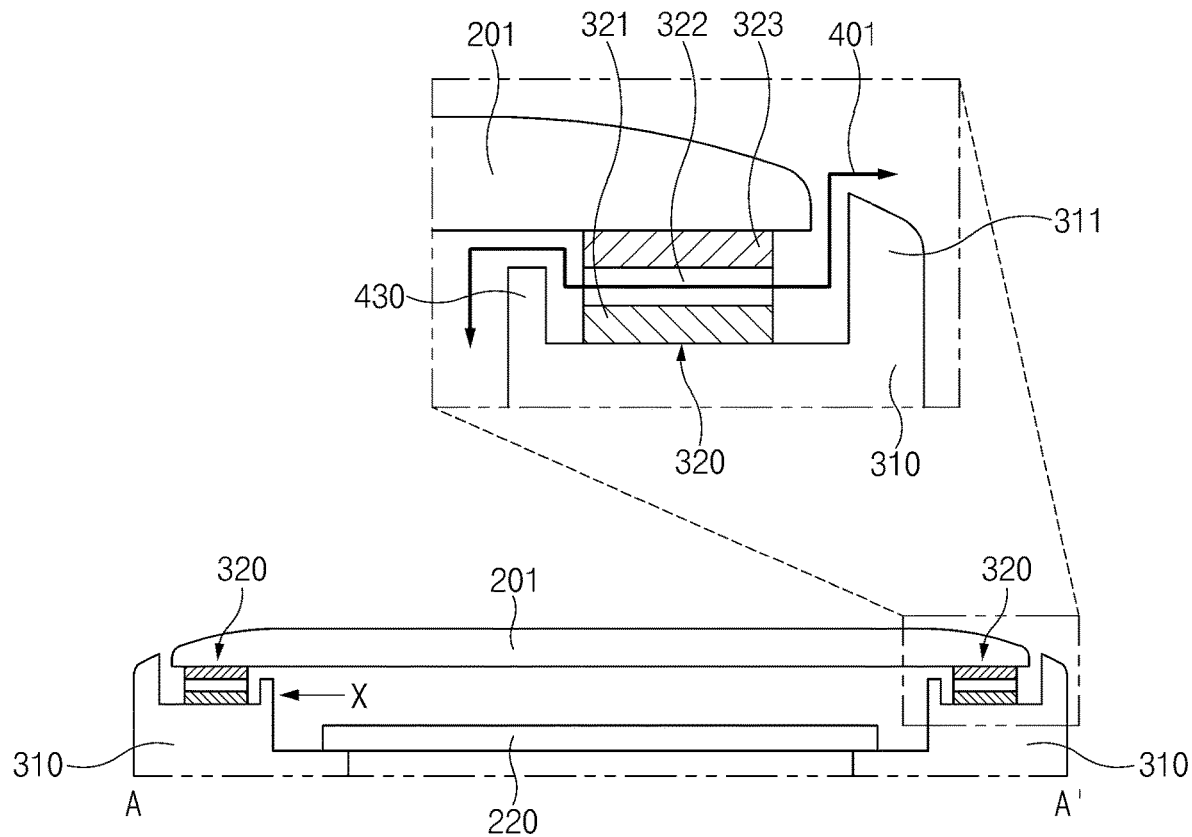
FIG. 4B is a view illustrating a sectional surface taken along line A-A' of FIG. 4A.

FIG. 4A is a view illustrating the wearable electronic device of FIG. 2A when viewed from the front. FIG. 4B is a view illustrating a sectional surface taken along line A-A' of FIG. 4A. Referring to FIGS. 3, 4A, and 4B, the first adhesive member 320 may be interposed between the front plate 201 and the side bezel structure 310.

The first adhesive member 320 is disposed between a side bezel structure 310 and the front plate 201. The side bezel structure includes a side wall 311 that forms a gap between the edge of the front plate 201 and a protrusion 430 that forms a gap between the bottom of the front plate 201. The first adhesive member 320 includes a first adhesive layer 321, a waterproof-ventilation layer 322, and a second adhesive layer 323. The gap between the protrusion 430 and the bottom of the front plate 201, the waterproof-ventilation layer 322 and the gap between the edge of the front plate 201 and the side wall 311 form a ventilation path 401 where gas can move inside to outside the wearable electronic device 300, and vice versa. However, liquid, and foreign substances are blocked by the first adhesive member 320.

According to an embodiment, the first adhesive member 320 may include a plurality of layers. For example, the first adhesive member 320 may include a first adhesive layer 321, a ventilation-waterproof layer 322, and a second adhesive layer 323. The first adhesive layer 321 may be attached to at least a portion of the side bezel structure 310. The second adhesive layer 323 may be attached to at least a portion of the front plate 201. The ventilation-waterproof layer 322 may be disposed between the first adhesive layer 321 and the second adhesive layer 323. The ventilation-waterproof layer 322 may transmit gas (e.g., air, oxygen, nitrogen, or carbon dioxide) and may block liquid (e.g., water). For example, the ventilation-waterproof layer 322 may include gore-tex, microtex, sympatex, entrant, hipora, biax, or hyvent. According to certain embodiments, the thickness of each of the first adhesive layer 321, the ventilation-waterproof layer 322, and the second adhesive layer 323 may be determined based on an amount of airflow or a waterproof level.

According to an embodiment, the first adhesive member 320 may have the shape of a circular band (or a polygonal band) corresponding to the frame shape of the front plate 201. For example, when the shape of the front plate 201 is a circular shape, the first adhesive member 320 may have the shape of a circular band. When the shape of the front plate 201 is a polygon shape (e.g., a quadrangle shape, a hexagonal shape, or an octagonal shape), the first adhesive member 320 may have the shape of a polygonal band.

According to an embodiment, the side bezel structure 310 may include a protrusion 430. For example, the protrusion 430 may have the shape of a circular (or polygonal) band corresponding to the shape of the first adhesive member 320. The protrusion 430 may be formed to maintain a specified distance to the front plate 201. When pressure is applied to the front plate 201 from the outside of the electronic device 300, the protrusion 430 may prevent the first adhesive member 320 from being compressed to be at a specific thickness (e.g., a half of the thickness of the first adhesive member 320) or less. The protrusion 430 may be integrated with the side bezel structure 310. According to certain embodiments, the protrusion 430 may be separately formed and may be coupled to the side bezel structure 310. According to certain embodiments, the height of the protrusion 430 may be changed depending on the material of the first adhesive member 320. According to certain embodiments, when the first adhesive member 320 is not affected by compression, the protrusion 430 may be omitted.

According to an embodiment, the ventilation-waterproof layer 322 of the first adhesive member 320 may be used as a ventilation path 401. For example, gas (e.g., air) may move through the ventilation path 401. The ventilation path 401 may be formed in all directions (e.g., at 360 degrees) through a gap between the front plate 201 and the side bezel structure 310. Even if a portion of the ventilation-waterproof layer 322 is blocked due to a specific situation (e.g., the situation that a foreign matter is introduced into the gap between the front plate 201 and the side bezel structure 310), the ventilation path 401 may be maintained through a remaining portion of the ventilation-waterproof layer 322.

Figure 4C:
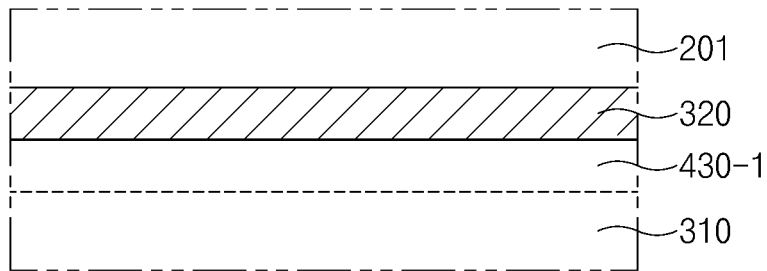
FIG. 4C is a view viewed from part X in a protrusion of FIG. 4B.
Figure 4C:
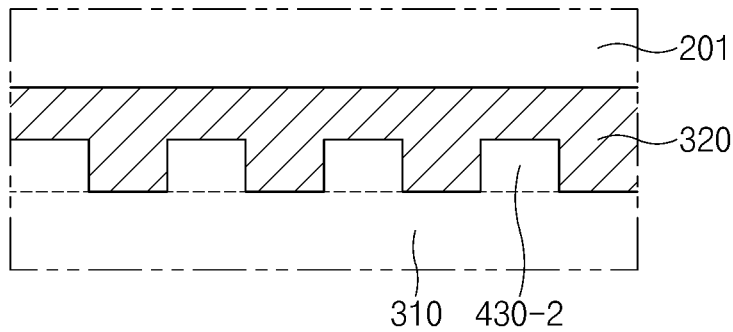
Figure 4C:
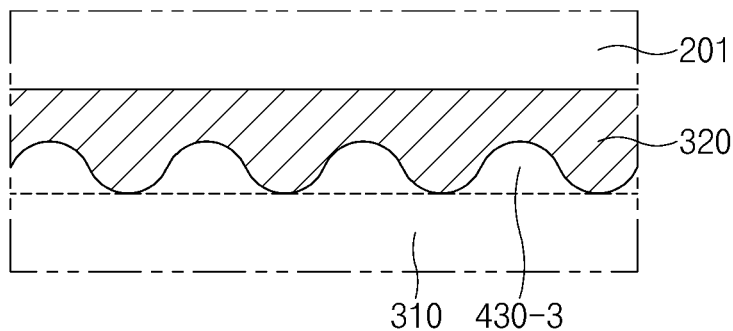

FIG. 4C is a view viewed from part X in a protrusion of FIG. 4B. Referring to FIG. 4C, the protrusion 430 may be formed in various shapes when viewed from the inside of the electronic device 300.

In a first example 401, a protrusion 430-1 may have the form of a flat surface in the shape of a long strip. When pressure is applied to the front plate 201 from the outside, the protrusion 430-1 may stably support the first adhesive member 320 such that the first adhesive member 320 is not compressed to be at a specific thickness or less.

According to certain embodiments, in a second example 402, a protrusion 430-2 may have the form of a lattice having patterns repeated at specified distances. When pressure is applied to the front plate 201 from the outside, the protrusion 430-2 may stably support the first adhesive member 320 such that the first adhesive member 320 is not compressed to be at a specific thickness or less, and may provide a ventilation property more improved as compared to that of the protrusion 430-1.

According to certain embodiments, in a third example 403, a protrusion 430-3 may have the form of waves repeated at specified distances. When pressure is applied to the front plate 201 from the outside, the protrusion 430-3 may stably support the first adhesive member 320 such that the first adhesive member 320 is not compressed to be at a specific thickness or less, and may provide a ventilation property more improved as compared to that of the protrusion 430-1.

Figure 5A:
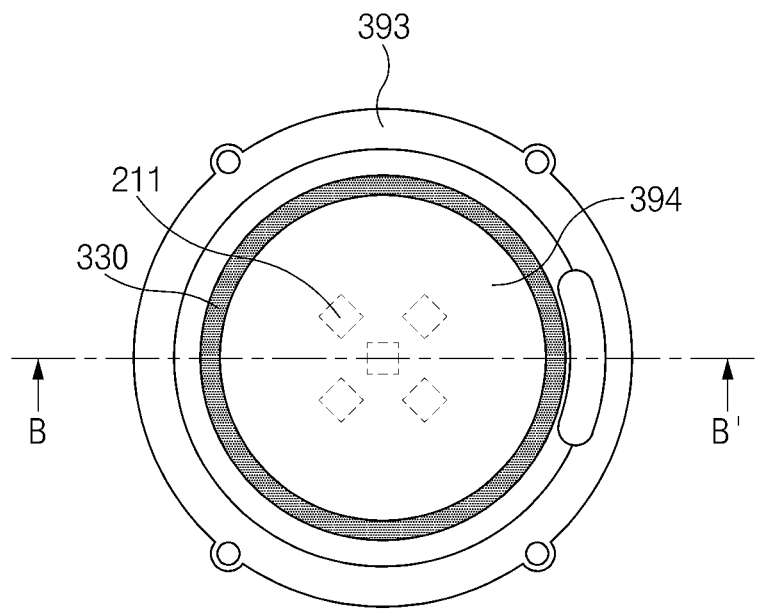
FIG. 5A is a view illustrating the wearable electronic device of FIG. 2A when viewed from the rear.
Figure 5B:
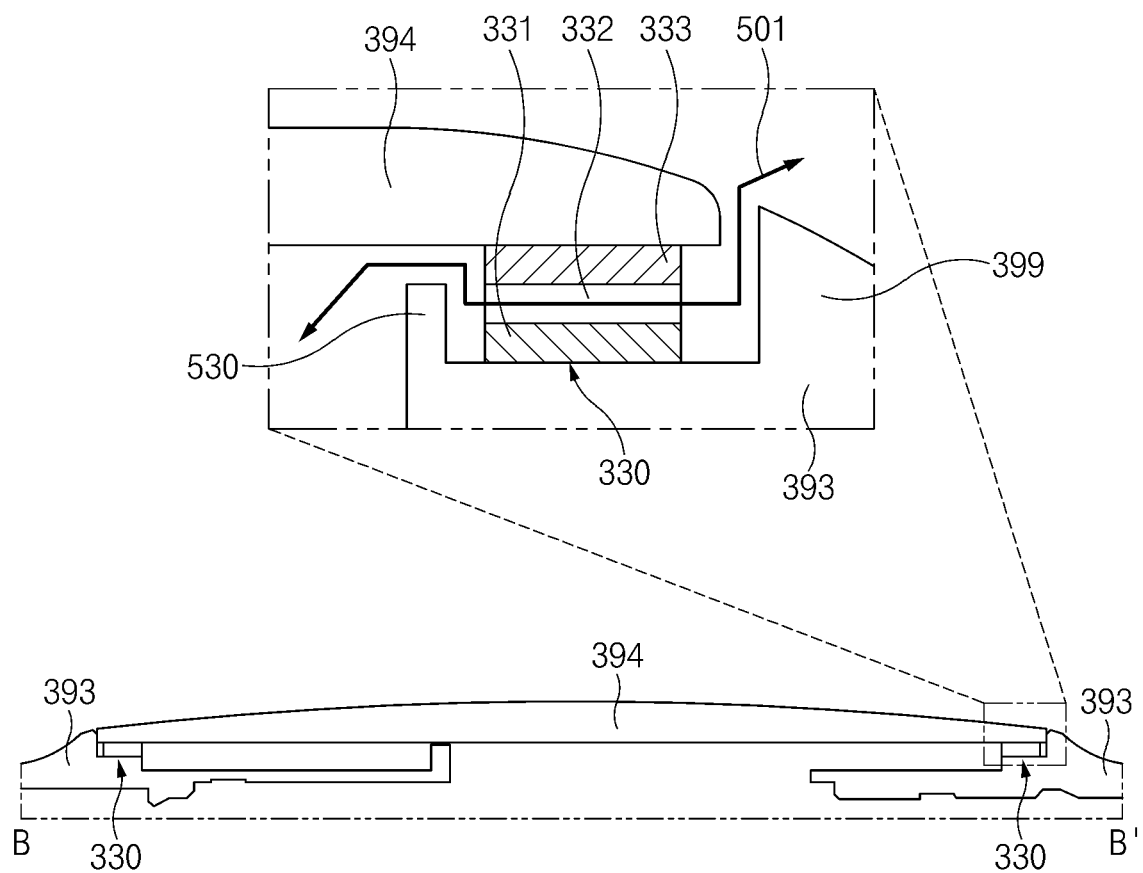
FIG. 5B is a view illustrating a sectional surface taken along line B-B' of FIG. 5A.

FIG. 5A is a view illustrating the wearable electronic device of FIG. 2A when viewed from the rear. FIG. 5B is a view illustrating a sectional surface taken along line B-B' of FIG. 5A. Referring to FIGS. 3, 5A, and 5B, the second adhesive member 330 may be interposed between the second rear plate 394 and the first rear plate 393.

The first rear plate includes a protrusion 530 that forms a gap between the top of the second rear plate 394 (where the wearable electronic device 300 is oriented such that the front plate is at the top). The first rear plate also includes a side portion 399 that forms a gap with the edge of the second rear plate 394. The second adhesive member 330 includes a first adhesive layer 331, a waterproof-ventilation layer 332, and a second adhesive layer 333. The gap between the protrusion 530 and the bottom of the top of the second rear plate 394, the waterproof-ventilation layer 332 and the gap between the edge of the second rear plate 394 and the side portion 399 form a ventilation path 501 where gas can move inside to outside the wearable electronic device 300, and vice versa. However, liquid, and foreign substances are blocked by the first adhesive member 320.

According to an embodiment, the second adhesive member 330 may include a plurality of layers. For example, the second adhesive member 330 may include a first adhesive layer 331, a ventilation-waterproof layer 332, and a second adhesive layer 333. The first adhesive layer 331 may be attached to at least a portion of the first rear plate 393. The second adhesive layer 333 may be attached to at least a portion of the second rear plate 394. The ventilation-waterproof layer 332 may be interposed between the first adhesive layer 331 and the second adhesive layer 333. The ventilation-waterproof layer 332 may transmit gas (e.g., air, oxygen, nitrogen, or carbon dioxide) and may block liquid (e.g., water). The ventilation-waterproof layer 332 may include gore-tex.

According to an embodiment, the second adhesive member 330 may have the shape of a circular band (or a polygonal band) corresponding to the frame shape of the second rear plate 394. For example, when the shape of the second rear plate 394 is a circular shape, the second adhesive member 330 may have the shape of a circular band. When the shape of the second rear plate 394 is a polygon shape (e.g., a quadrangle shape, a hexagonal shape, or an octagonal shape), the second adhesive member 330 may have the shape of a polygonal band.

According to an embodiment, the first rear plate 393 may include a protrusion 530. For example, the protrusion 530 may have the shape of a circular (or polygonal) band corresponding to the shape of the second adhesive member 330. The protrusion 530 may be formed to maintain a specified distance to the second rear plate 394. When pressure is applied to the second rear plate 394 from the outside of the electronic device 300, the protrusion 530 may prevent the second adhesive member 330 from being compressed to be at a specific thickness or less. When the second adhesive member 330 is compressed to be at a specific thickness or less, the ventilation performance may be degraded due to the second adhesive member 330. The protrusion 530 may be formed integrally with the first rear plate 393. According to certain embodiments, the protrusion 530 may be separately formed and may be coupled to the first rear plate 393. According to certain embodiments, the height of the protrusion 530 may be changed depending on the material of the second adhesive member 330. According to certain embodiments, when the second adhesive member 330 is not affected by compression, the protrusion 530 may be omitted.

According to an embodiment, the ventilation-waterproof layer 332 of the second adhesive member 330 may be used as a ventilation path 501. For example, gas (e.g., air) may move through the ventilation path 501. The ventilation path 501 may be formed in all directions (e.g., at 360 degrees) through a gap between the second rear plate 394 and the first rear plate 393. Even if a portion of the ventilation-waterproof layer 332 is blocked under a specific situation (e.g., the situation that a foreign matter is introduced into the gap between the second rear plate 394 and the first rear plate 393), the ventilation path 501 may be maintained through a remaining portion of the ventilation-waterproof layer 332.

Figure 6A:
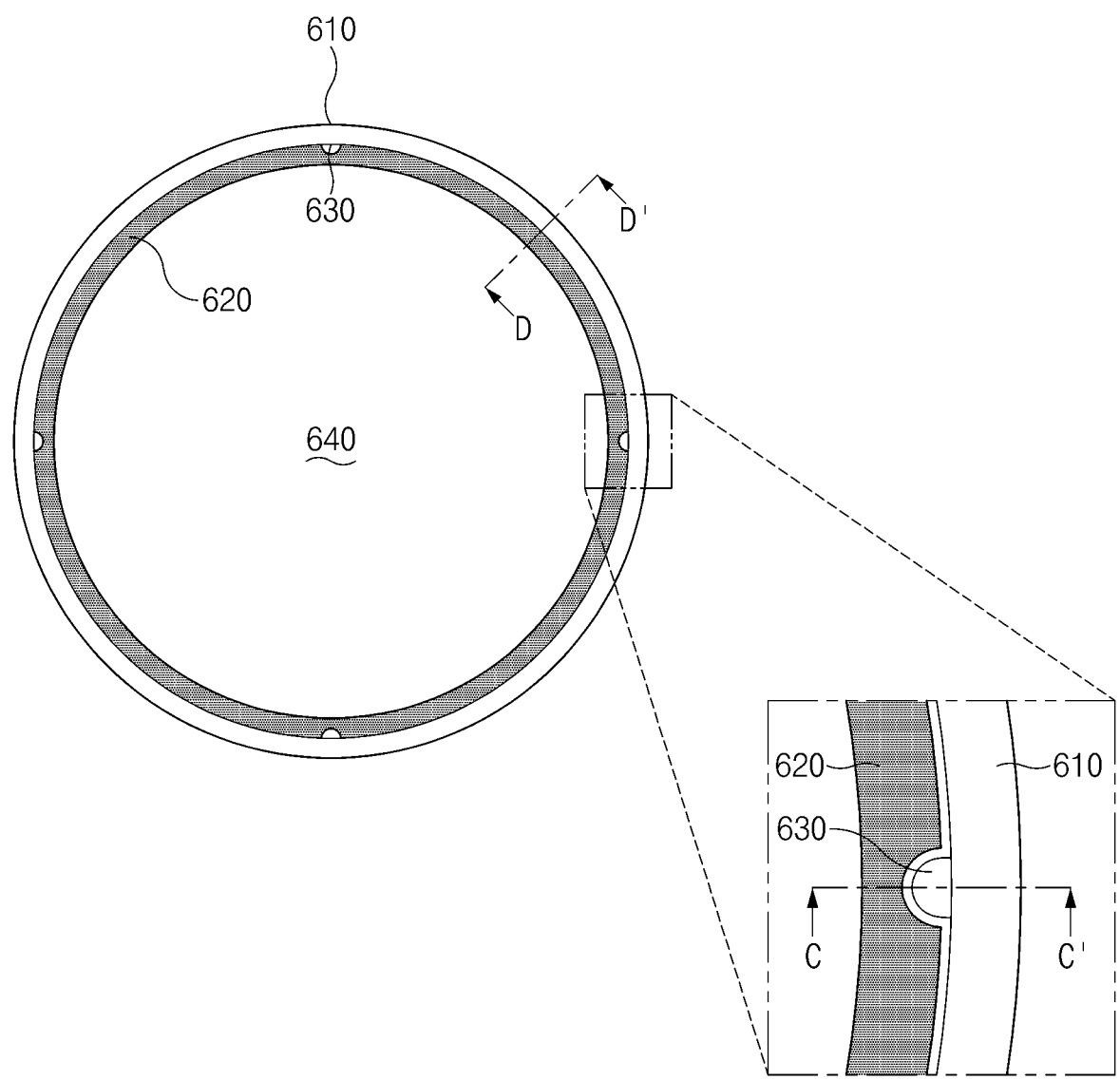
FIG. 6A is a view illustrating a ventilation and waterproof structure of an electronic device, according to certain embodiments.
Figure 6B:
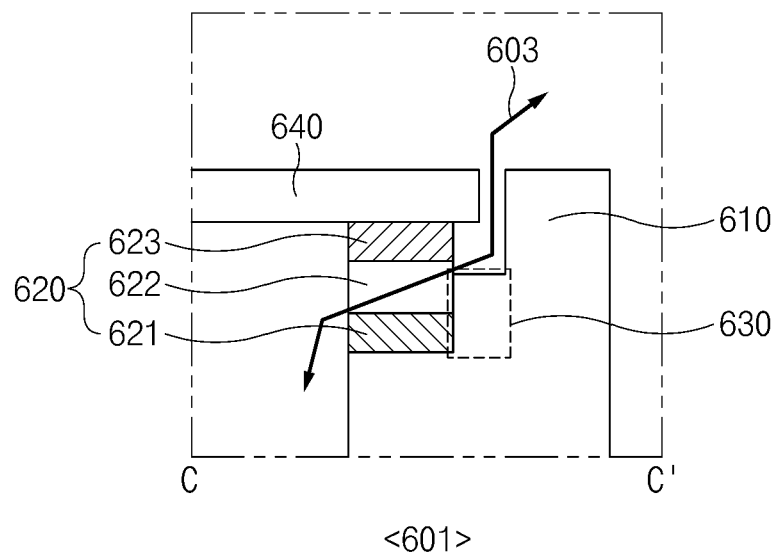
FIG. 6B is a view illustrating a sectional surface taken along lines C-C' and D-D' of FIG. 6A.
Figure 6B:
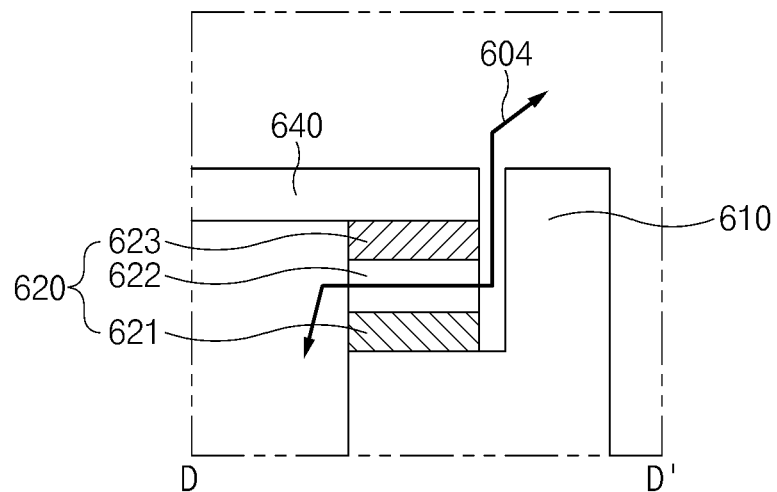

FIG. 6A is a view illustrating a ventilation and waterproof structure of an electronic device, according to certain embodiments. FIG. 6B is a view illustrating a sectional surface taken along lines C-C' and D-D' of FIG. 6A.

Referring to FIGS. 6A and 6B, a plate 640 (e.g., the front plate 201 and the second rear plate 394) of an electronic device (e.g., the electronic device 300) may be coupled to one surface of a housing 610 (e.g., the side bezel structure 310 and the first rear plate 393). An adhesive member 620 (e.g., the first adhesive member 320 and the second adhesive member 330) may be interposed between the plate 640 and the housing 610. The adhesive member 620 may be disposed at the coupling portion between the plate 640 and the housing 610.

According to an embodiment, the adhesive member 620 may include a plurality of layers. For example, the adhesive member 620 may include a first adhesive layer 621 (e.g., the first adhesive layer 321 or the first adhesive layer 331), a ventilation-waterproof layer 622 (e.g., the ventilation-waterproof layer 322 or the ventilation-waterproof layer 332), and a second adhesive layer 623 (e.g., the second adhesive layer 323 or the second adhesive layer 333). The first adhesive layer 621 may be attached to at least a portion of the housing 610. The second adhesive layer 623 may be attached to at least a portion of the plate 640. The ventilation-waterproof layer 622 may be interposed between the first adhesive layer 621 and the second adhesive layer 623. The ventilation-waterproof layer 622 may transmit gas (e.g., air, oxygen, nitrogen, or carbon dioxide) and may block liquid (e.g., water). The ventilation-waterproof layer 622 may include gore-tex.

According to an embodiment, a protrusion 630 (e.g., the protrusion 430 or the protrusion 530) may be at least partially formed in the housing 610. For example, the adhesive member 620 may have the shape of a band corresponding to the frame shape of the plate 640. The adhesive member 620 may include a roughness member having the shape corresponding to the protrusion 630, in a portion corresponding to the protrusion 630. The adhesive member 620 may have mutually different widths in a portion having the protrusion 630 and a portion having no protrusion 630. For example, the adhesive member 620 may be formed to be narrower in the portion having the protrusion 630, than the portion having no protrusion 630. According to certain embodiments, a plurality of protrusions 630 may be formed along the coupling portion between the plate 640 and the housing 610. The protrusions 630 may be spaced apart from each other by a specified distance therebetween. The protrusions 630 may be formed to have a specified distance from the plate 640.

According to an embodiment, ventilation may be performed through a first path 603 in a portion 601 having the protrusion 630. The ventilation may be performed through a second path 604 in a portion 602 having no protrusion 630. According to certain embodiments, when pressure is applied to the plate 640 from the outside, even if ventilation is not performed partially in the first path 603, the ventilation may be performed through the second path 604.

According to certain embodiment, an electronic device (e.g., the electronic device 101, or the wearable electronic device 200 or 300) may include a housing (e.g., the housing 210), a plate (e.g., the front plate 201, the rear plate 207, the first rear plate 393, or the second rear plate 394) coupled to one surface of the housing, and an adhesive member (e.g., the first adhesive member 320, the second adhesive member 330, or the adhesive member 620) at least partially disposed in a coupling portion between the housing and the plate and including a plurality of layers. The adhesive member includes at least one ventilation-waterproof layer (e.g., a ventilation-waterproof layer 322, 332, or 622) to perform a ventilation function and a waterproof function.

According to certain embodiments, the adhesive member may include a first adhesive layer (e.g., the first adhesive layer 321, 331, or 621) attached to the housing, and a second adhesive layer (e.g., the second adhesive layer 323, 333, or 623) attached to the plate. The ventilation-waterproof layer may be interposed between the first adhesive layer and the second adhesive layer and may perform the ventilation function and the waterproof function.

According to certain embodiments, the adhesive member may be formed in a shape of a circular band or a polygonal band corresponding to a frame shape of the plate.

According to certain embodiments, the electronic device may further include a protrusion (e.g., the protrusion 430, 530, or 630) which is disposed in the coupling portion between the housing and the plate and prevents the adhesive member from being compressed to be at a specific thickness or less with respect to external pressure applied to the plate.

According to certain embodiments, the protrusion may be disposed to be maintained at a specified distance to the plate.

According to certain embodiments, the protrusion may be formed in a shape of a circular band or a polygonal band corresponding to a shape of the adhesive member.

According to certain embodiments, the protrusion may be disposed at a plurality of points at specified distances along the coupling portion between the housing and the plate.

According to certain embodiments, the protrusion may be integrally formed with the housing.

According to certain embodiments, the protrusion may be formed separately from the housing and coupled to the housing.

According to certain embodiments, an electronic device may include a side bezel structure (e.g., the side bezel structure 206 or 310), a display (e.g., the display 220) disposed inside the side bezel structure, a plate coupled to the side bezel structure, in a displaying direction of the display, and an adhesive member at least partially disposed in a coupling portion between the side bezel structure and the plate and including a plurality of layers. The adhesive member may include at least one ventilation-waterproof layer to perform a ventilation function and a waterproof function.

According to certain embodiments, the adhesive member may include a first adhesive layer attached to the side bezel structure, and a second adhesive layer attached to the plate. The ventilation-waterproof layer may be interposed between the first adhesive layer and the second adhesive layer and may perform the ventilation function and the waterproof function.

According to certain embodiments, the adhesive member may be formed in a shape of a circular band or a polygonal band corresponding to a frame shape of the plate.

According to certain embodiments, the electronic device may further include a protrusion which is disposed in the coupling portion between the side bezel structure and the plate and prevent the adhesive member from being compressed to be at a specific thickness or less with respect to external pressure applied to the plate.

According to certain embodiments, the protrusion may be formed in a shape of a circular band or a polygonal band corresponding to a shape of the adhesive member.

According to certain embodiments, the protrusion may be disposed at a plurality of points at specified distances along the coupling portion between the side bezel structure and the plate.

According to certain embodiments, an electronic device may include a side bezel structure, a first plate (e.g., the first rear plate 393) coupled to one surface which is open in the side bezel structure, a sensor (e.g., the sensor module 211) disposed on the first plate, a second plate (e.g., the second rear plate 394) coupled to the first plate to cover the sensor, and an adhesive member at least partially disposed in a coupling portion between the first plate and the second plate and including a plurality of layers. The adhesive member may include at least one ventilation-waterproof layer to perform a ventilation function and a waterproof function.

According to certain embodiments, the adhesive member may include a first adhesive layer attached to the first plate, and a second adhesive layer attached to the second plate. The ventilation-waterproof layer may be interposed between the first adhesive layer and the second adhesive layer and may perform the ventilation function and the waterproof function.

According to certain embodiments, the adhesive member may be formed in a shape of a circular band or a polygonal band corresponding to a frame shape of the second plate.

According to certain embodiments, the electronic device may further include a protrusion which is disposed in the coupling portion between the first plate and the second plate and prevents the adhesive member from being compressed to be at a specific thickness or less with respect to external pressure applied to the second plate.

According to certain embodiments, the protrusion may be disposed in the first plate to be spaced apart from the second plate by a specified distance, and formed in a shape of a circular band or a polygonal band corresponding to a shape of the adhesive member.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

According to embodiments of the disclosure, the wearable electronic device may include the adhesive member including the plurality of layers and disposed in the coupling part between the housing and the front plate (or rear plate), and the adhesive member may include at least one ventilation-waterproof layer to provide the ventilation function and the waterproof function without the additional ventilation hole.

Besides, a variety of effects directly or indirectly understood through the disclosure may be provided.

While the disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing;
   a plate coupled to one surface of the housing;
   an adhesive member at least partially disposed in a coupling portion between the housing and the plate and including a plurality of layers; and
   a protrusion disposed in the coupling portion between the housing and the plate and protruding toward the plate from the housing,
   wherein the adhesive member includes at least one waterproof-ventilation layer to perform a ventilation function and a waterproof function, and
   wherein the waterproof-ventilation layer communicates with a gap between the plate and the protrusion to form a ventilation path.

2. The electronic device of claim 1, wherein the adhesive member further includes:
   a first adhesive layer attached to the housing; and
   a second adhesive layer attached to the plate,
   wherein the waterproof-ventilation layer is interposed between the first adhesive layer and the second adhesive layer.

3. The electronic device of claim 1, wherein the adhesive member is formed in a shape of a circular band or a polygonal band corresponding to a frame shape of the plate.

4. The electronic device of claim 1, wherein the protrusion is disposed at a specified distance to the plate.

5. The electronic device of claim 1 wherein the protrusion is formed in a shape of a circular band or a polygonal band corresponding to a shape of the adhesive member.

6. The electronic device of claim 1 wherein the protrusion is disposed at a plurality of points at specified distances along the coupling portion between the housing and the plate.

7. The electronic device of claim 1 wherein the protrusion is integrally formed with the housing.

8. The electronic device of claim 1 wherein the protrusion is formed separately from the housing and coupled to the housing.

9. The electronic device of claim 1, wherein the housing and the plate form the coupling portion, including an air channel being the gap defined between the housing and the plate, and a groove formed in a surface of the housing and forming part of the air channel; and
   wherein the adhesive member at least partially is disposed in the air channel of the coupling portion and seated in the groove of the housing.

10. The electronic device of claim 9, wherein a lengthwise axis of the adhesive member is parallel to a plane formed by a surface of the groove formed in the housing.

11. An electronic device comprising:
    a side bezel structure;
    a display disposed inside the side bezel structure;
    a plate coupled to the side bezel structure, in a displaying direction of the display;
    an adhesive member at least partially disposed in a coupling portion between the side bezel structure and the plate and including a plurality of layers; and
    a protrusion disposed in the coupling portion between the side bezel structure and the plate and protruding toward the plate from the side bezel structure,
    wherein the adhesive member includes at least one waterproof-ventilation layer having a ventilation function and a waterproof function, and
    wherein the waterproof-ventilation layer communicates with a gap between the plate and the protrusion to form a ventilation path.

12. The electronic device of claim 11, wherein the adhesive member further includes:
    a first adhesive layer attached to the side bezel structure; and
    a second adhesive layer attached to the plate,
    wherein the waterproof-ventilation layer is interposed between the first adhesive layer and the second adhesive.

13. The electronic device of claim 11, wherein the adhesive member is formed in a shape of a circular band or a polygonal band corresponding to a frame shape of the plate.

14. The electronic device of claim 11, wherein the protrusion is formed in a shape of a circular band or a polygonal band corresponding to a shape of the adhesive member.

15. The electronic device of claim 11, wherein the protrusion is disposed at a plurality of points at specified distances along the coupling portion between the side bezel structure and the plate.

16. An electronic device comprising:
    a side bezel structure;
    a first plate coupled to one surface which is open in the side bezel structure;
    a sensor disposed on the first plate;
    a second plate coupled to the first plate to cover the sensor; and an adhesive member at least partially disposed in a coupling portion between the first plate and the second plate and including a plurality of layers, a protrusion disposed in the coupling portion between the first plate and the second plate and prevents the adhesive member from being compressed to be at a specific thickness or less with respect to external pressure applied to the second plate;

wherein the adhesive member includes at least one waterproof-ventilation layer to perform a ventilation function and a waterproof function.

17. The electronic device of claim 16, wherein the adhesive member further includes:

a first adhesive layer attached to the first plate; and a second adhesive layer attached to the second plate, wherein the waterproof-ventilation layer is interposed between the first adhesive layer and the second adhesive layer.

18. The electronic device of claim 16, wherein the adhesive member is formed in a shape of a circular band or a polygonal band corresponding to a frame shape of the second plate.

19. The electronic device of claim 16, wherein the protrusion is disposed in the first plate to be spaced apart from the second plate by a specified distance, and formed in a shape of a circular band or a polygonal band corresponding to a shape of the adhesive member.

* * * * *